United States Patent
Wu et al.

[11] Patent Number: 6,043,141
[45] Date of Patent: Mar. 28, 2000

[54] METHOD FOR IN SITU GROWTH OF P-TYPE DOPED GROUP II-VI SEMICONDUCTOR FILMS

[75] Inventors: Owen K. Wu, Westlake Village; Rajesh D. Rajavel, Agoura, both of Calif.

[73] Assignee: Hughes Electronics Corporation, El Segundo, Calif.

[21] Appl. No.: 08/965,391

[22] Filed: Nov. 6, 1997

[51] Int. Cl.[7] .................................................. H01L 21/20
[52] U.S. Cl. .................. 438/508; 438/478; 438/507; 438/971; 117/956; 117/957
[58] Field of Search ................... 117/956, 957; 438/478, 507, 508, 505, 509, 913, 971

[56] References Cited

PUBLICATIONS

L. He et al., "Molecular beam epitaxial growth and evaluation of intrinsic and extrinsically doped HgCdTe on (100) CdZnTe", J. Appl. Phys. 73(7) pp. 3305–3312, Apr. 1993.

S.H. Shin, "Annealing effect on the p–type carrier concentration in low–temperature processed arsenic doped HgCdTe", J. Elect. Matl. 22 (8) pp. 1039–1047, Aug. 1993.

*Primary Examiner*—Charles Bowers
*Assistant Examiner*—Keith Christianson
*Attorney, Agent, or Firm*—V. D. Duraiswamy; M. W. Sales

[57] ABSTRACT

A method of growing a p-type doped Group II–VI semiconductor film includes the steps of forming a lattice comprising a Group II material and a Group VI material wherein a cation-rich condition is established at a surface of the lattice. The method further includes the steps of generating an elemental Group V flux by evaporating an elemental Group V material and providing the elemental Group V flux to a Group VI sublattice of the lattice.

20 Claims, 2 Drawing Sheets

METHOD FOR IN SITU GROWTH OF P-TYPE DOPED GROUP II-VI SEMICONDUCTOR FILMS

BACKGROUND OF THE INVENTION

1. Field of the Invention

The invention relates generally to the growth of Group II–VI semiconductor films for use in infrared detection devices and, more particularly, to the in situ growth of p-type doped HgCdTe films.

2. Description of the Related Art

The formation of p-type layers in Group II–VI semiconductor structures is critical to the production of heterojunction, multileveled structures for use in infrared ("IR") detectors. While suitable n-type doping techniques are known, present p-type doping techniques for Group II–VI semiconductors, such as HgCdTe alloys, leave significant room for improvement.

Molecular beam epitaxy ("MBE"), a vacuum deposition process, is a typical method of preparing HgCdTe alloys. A conventional MBE process for the growth of an HgCdTe alloy is described in J. P. Faurie et al., "Molecular Beam Epitaxy of II–VI Compounds: $Cd_xHg_{1-x}Te$," *J. Cryst. Growth*, Vol. 54, No. 3, pp. 582–585 (1981), the disclosure of which is incorporated herein by reference. MBE growth processes provide for in situ growth of high quality epilayers and abrupt heterojunctions, each of which is desirable for the construction of high performance IR detectors. Such in situ growth processes also advantageously produce multilayer devices in a single growth run.

U.S. Pat. No. 5,028,561 (assigned to the assignee of the present application) discloses an MBE process for growing a p-type HgCdTe film utilizing a dopant flux generated from an $X_3Y_2$ compound, where X is a Group II element such as cadmium (Cd) and Y is a Group V element such as arsenic (As). Such a dopant flux provides sufficient Group II element to occupy metal (usually mercury (Hg)) vacancies in the Group II sublattice, thereby leaving the Group V dopant (arsenic) available to enter the Group VI sublattice to achieve p-type doping.

Providing both the Group II element and the Group V element is necessary because the Group V element (arsenic) is amphoteric in Group II–VI semiconductors such as HgCdTe and ZnSe. The arsenic could, therefore, dope the growing layer n-type by occupying the metal vacancies rather than entering the Group VI sublattice.

However, the preferred $X_3Y_2$ compound in the aforementioned process, $Cd_3As_2$, is very difficult to obtain in high purities. To achieve a suitable purity level of, for instance, 99.99999%, additional costly and potentially ineffectual purification steps must be performed. Without sufficient purification, impurities such as organic compounds and/or water vapor left in the flux may compensate the p-type dopants to a potentially large extent.

Other techniques used to p-type dope HgCdTe alloys have been found undesirable. For example, ion implantation techniques generally cause too much damage to the lattice, thereby requiring significant repair efforts involving relatively high temperature annealing that destroys the heterojunction interfaces. For this reason, these techniques are not readily applied to the fabrication of n-p-n multilayer structures. Moreover, devices fabricated by ion implantation techniques may have significantly reduced minority carrier lifetimes due to lingering effects created from the implant.

Another approach to growing p-type doped HgCdTe films involves an interdiffused superlattice process ("ISP"), which includes the growth of a p-type HgTe/CdTe superlattice structure wherein the CdTe layer is doped with arsenic. In this process, a high temperature anneal (at about 450° C.) under mercury overpressure creates an HgCdTe epilayer through interdiffusion. The high temperature anneal is followed by a mercury vacancy anneal at a comparatively low temperature (about 250° C.). Suitable p-type doping of the epilayer is accomplished by doping the CdTe layer, which may be done under excess mercury flux so that the arsenic dopant can be selectively incorporated into the Group VI sublattice.

However, devices constructed through the ISP process have encountered several problems believed to be based on the following structural defects. First, the arsenic may not be uniformly distributed after the high temperature anneal. Furthermore, the high temperature anneal typically destroys the p-n junction interface, thereby rendering it difficult to control the precise junction location. Finally, the quality of the superlattice may be compromised due to differences in the optimal growth temperatures of the individual layers.

SUMMARY OF THE INVENTION

The method according to the present invention is useful in connection with the growth of p-type doped Group II–VI semiconductor films. The inventive method includes the step of forming a lattice including a Group II material and a Group VI material wherein a cation-rich condition is established at the lattice surface. The inventive method further includes the steps of generating an elemental Group V flux by evaporating an elemental Group V material and providing the elemental Group V flux to the lattice surface.

According to a preferred embodiment of the inventive method, the elemental Group V material includes elemental arsenic. The lattice forming step may include generating, via evaporation, a Group II flux and a Group VI flux according to a predetermined Group ll:Group VI flux ratio to establish the cation-rich condition at the surface of the lattice. The inventive method may further include the steps of generating a flux comprising cadmium and tellurium by evaporating cadmium telluride and providing the flux comprising cadmium and tellurium to the surface of the lattice. Still further, the Group II material may be mercury and the Group VI material may be tellurium.

In accordance with an alternative embodiment of the present invention, a method of fabricating a p-type doped HgCdTe semiconductor film for an infrared detector includes the steps of generating a first flux including mercury and a second flux including tellurium according to a predetermined Hg:Te flux ratio and further generating an elemental Group V flux. The first flux and the second flux are provided to a substrate to grow a lattice thereon and the Hg:Te flux ratio is in a range from about 125 to about 1000 to direct the elemental Group V flux to a Group VI sublattice of the lattice.

DETAILED DESCRIPTION OF THE INVENTION

Figure 1:
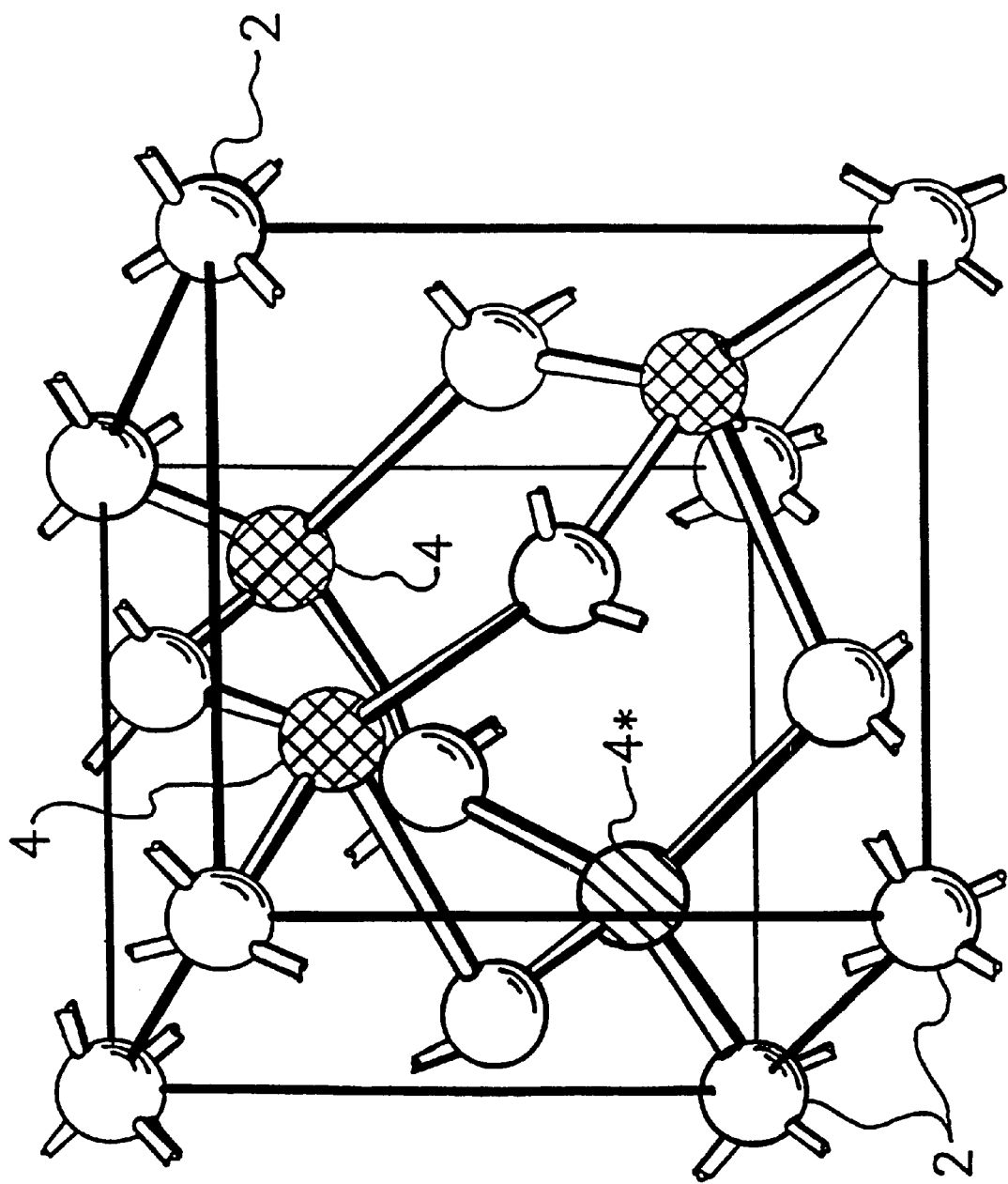
FIG. 1 is a three-dimensional representation of a lattice structure of an MBE-grown Group II–VI material to be p-doped in accordance with the invention.

Referring to FIG. 1, conventional molecular beam epitaxy or metal-organic molecular beam epitaxy (collectively referred to as "MBE") has provided the capability of growing films or layers of Group II–VI semiconductor material comprising a lattice having a Group II sublattice and a Group VI sublattice. For example, one Group II–VI semiconductor, HgCdTe, includes a lattice having a basic cubic structure with mercury (Hg) and cadmium (Cd) positioned in a face-centered cube interwoven with another face-centered cube of tellurium (Te). The proportion of mercury and cadmium is substantially equal to the proportion of tellurium, such that HgCdTe is, in actuality, $Hg_{1-x}Cd_xTe$, where x is a fraction of one. Source material selection is one of several controlling factors known to those skilled in the art that determine the proportion of cadmium to mercury. As shown in FIG. 1, the Group VI element (tellurium) occupies sites 2, while the Group II elements (cadmium and mercury) occupy sites 4. A metal vacancy is indicated by a shaded circle at site 4* and generally corresponds with what would be a mercury site.

Although a particular example of a Group II/VI material is described above, the present invention is generally applicable to the growth and doping of numerous other Group II–VI semiconductor materials, including, for example, ZnSe. Any one or more of the following Group II materials, including mixtures thereof, may be used: zinc (Zn), cadmium (Cd), mercury (Hg), and magnesium (Mg). Similarly, the Group VI material may be selected from sulfur (S), selenium (Se), and tellurium (Te), including mixtures thereof. As will be understood by those skilled in the art, different combinations of the above-identified materials, along with different composition percentages of like-Group materials, will vary the size of the energy bandgap that determines which portion of the infrared spectrum will be detected by the IR detector device fabricated. For example, a long-wave IR detector has been fabricated from an $Hg_{1-x}Cd_xTe$ alloy having x=0.22, while a short-wave IR detector has been fabricated from an $Hg_{1-x}Cd_xTe$ alloy having x=0.75.

Figure 2:
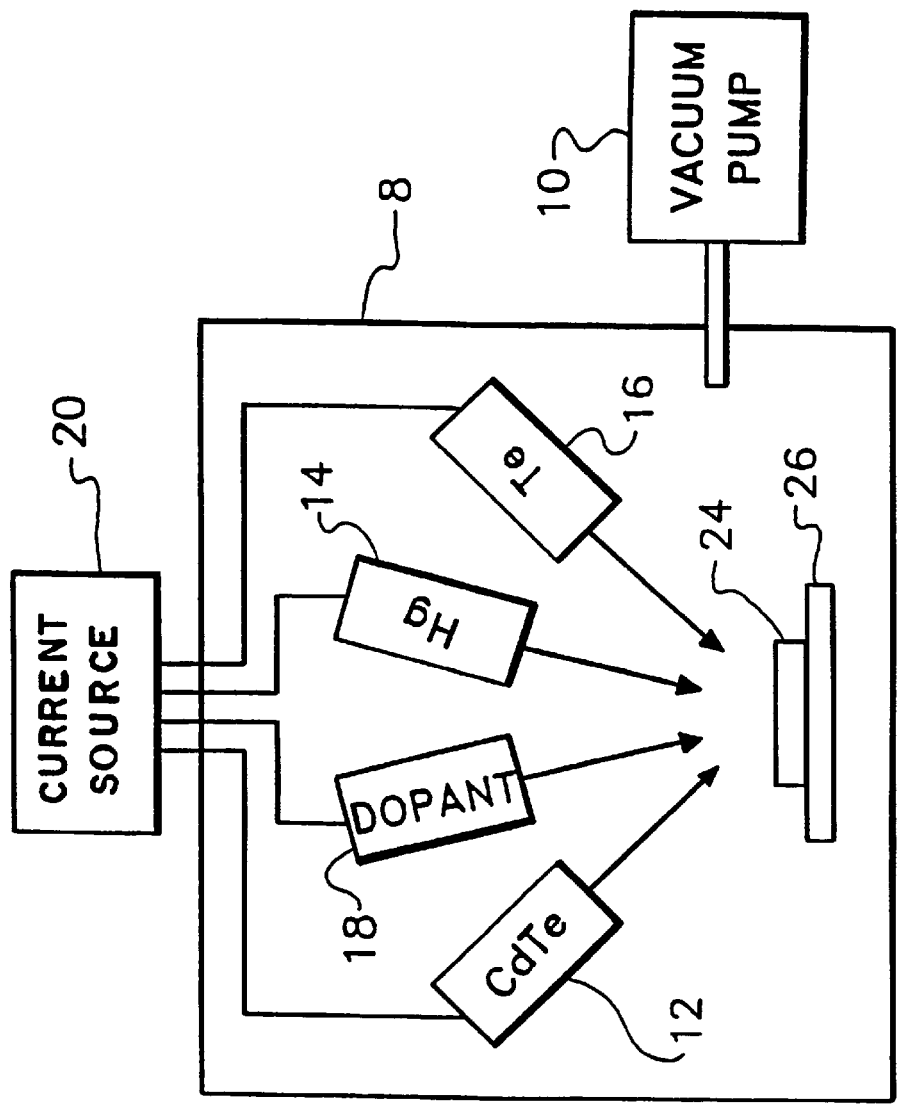
FIG. 2 is a schematic diagram illustrating an MBE apparatus used to practice the invention.

Referring now to FIG. 2, a conventional MBE chamber 8 is maintained at a base pressure of about $10^{-10}$ milliBar by a vacuum pump 10. During operation, the background pressure in the MBE chamber 8 (i.e., the pressure in regions other than where the evaporated source materials are directed) remains between approximately $10^{-7}$ milliBar and approximately $10^{-6}$ milliBar. The MBE chamber 8 includes multiple ports for attaching crucibles or other pressurized apparatus to provide the evaporated source materials. For the growth of a p-type doped HgCdTe layer, a first crucible (or effusion cell) 12 contains cadmium telluride (CdTe), a delivery tube/reservoir assembly 14 contains mercury, a second crucible 16 contains tellurium, and a third crucible 18 contains an elemental Group V dopant material, which is preferably arsenic (As). Each crucible (or reservoir) 12, 14, 16, and 18 includes coils (not shown) carrying current from a current source 20 to heat a zone of the respective crucible or reservoir and thereby evaporate the source material to generate a vapor flux thereof. Different compounds may form upon heating and/or evaporation of the source material (e.g., Cd and $Te_2$). Accordingly, each crucible may also include (or be coupled to) a second heating zone (e.g., a cracker zone) for decomposition or disassociation of the vapor fluxes. A respective coupling apparatus (not shown) for each crucible (or reservoir) 12, 14, 16, and 18 then provides each of the vapor fluxes to the MBE chamber 8.

The vapor fluxes are directed onto a substrate 24 placed on a platform 26. The substrate 24 may include a CdTe lattice having about 4% of the Group II sites taken up by zinc (Zn), such that the substrate 24 is a CdZnTe alloy. However, the substrate may include one or more buffer or other layers epitaxially grown on a semiconductor support. As will be understood by those skilled in the art, the choice of a substrate (including any specific layers thereof) will depend upon factors such as (i) matching the coefficients of thermal expansion of the substrate and the epitaxially grown films or layers, and (ii) minimizing the effects of lattice mismatch between the substrate and the epitaxially grown films or layers. The use of a silicon (Si) support, for example, may require an intermediate buffer layer (such as CdTe) to accommodate the lattice mismatch between silicon and HgCdTe. Such a buffer layer may have a thickness of about 10 $\mu$m. For some applications, the use of a silicon support may provide added strength and durability while also reducing production costs.

Figure 3:
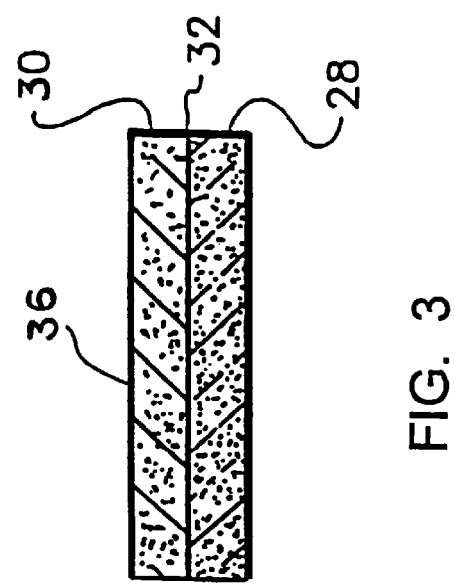
FIG. 3 is a sectional, schematic view of a p-n junction formed in accordance with the invention.

Referring now to FIG. 3, a simple p-n junction structure implemented by the present invention is illustrated. A base layer 28 of Group II–VI material is first grown on the substrate 24 (FIG. 2), or an associated intermediate layer, and doped by an MBE process. The base layer 28 may be doped n-type through conventional n-type doping techniques using indium (In). Upon the completion of the base layer 28, the dopant type is reversed (i.e., from n-type to p-type), and the MBE process is continued for growth of a p-type cap layer 30, thereby defining a junction 32 and a surface 36. In multilayer heterojunction structures, this nomenclature (ie., "base layer" and "cap layer") no longer applies, and the layers are simply referred to as either n-type or p-type. For example, the n-type layers and p-type layers in a two color detector may, in general, have thicknesses of about 6 $\mu$m to about 10 $\mu$m and about 1 $\mu$m to about 2.5 $\mu$m, respectively, and may be arranged as n-p-p-n structure.

A high temperature anneal (e.g., approximately 450° C. or higher) subsequent to the growth of the p-type cap layer 30 is not necessary to activate the dopants. To the extent any annealing is desirable, a low temperature anneal preferably at a temperature in a range from about 250° C. to about 300° C., and most preferably about 250° C., is sufficient to perfect the lattice and remove residual metal vacancies 4* and other defects in the Group II sublattice.

Annealing the lattice at a low temperature helps avoid the destruction of the junction 32 or other interfaces critical to high performance detectors.

The preferred dopant for the p-type cap layer 30 (for Group II–VI semiconductor materials) is arsenic, although other Group V materials may be used. However, the amphoteric nature of these Group V materials has made the growth of suitable p-type cap layers troublesome. To further complicate matters for HgCdTe alloys, because tellurium has, in general, a much higher sticking coefficient (close to 1.0) than mercury (e.g., approximately $2 \times 10^{-3}$ at 170° C.), there will be a tendency for MBE growth processes to create excess metal vacancies 4* in the Group II sublattice. Such vacancies undesirably facilitate the incorporation of arsenic into the Group II sublattice rather than the Group VI sublattice.

In order to direct the Group V dopant (e.g., arsenic) to the Group VI sublattice sites 2, a cation-rich condition at the surface 34 of the lattice is established according to the inventive method. If conditions at the surface 34 are such that Group II material (e.g., mercury) is present in excess, the Group II sublattice sites 4 will more likely be occupied by Group II material. Consequently, the probability of the Group V dopant flux being incorporated into the Group VI sublattice as a p-type dopant will increase.

With regard to Group II–VI semiconductor films, such a cation-rich surface condition is provided by ensuring a sufficiently high Group II:Group VI flux ratio for a given growth temperature. To estimate the magnitude of each flux, respective partial pressure measurements in the MBE chamber 8 may be taken. The particular Group II–VI semiconductor film to be fabricated will establish the nature and requisite magnitude of the Group II:Group VI flux ratio.

With regard to HgCdTe films in particular, the relevant Group II:Group VI flux is an Hg:Te flux ratio because, of the two Group II materials (mercury and cadmium), only mercury has a sticking coefficient significantly lower than tellurium (cadmium also has a sticking coefficient close to 1.0). Furthermore, the Hg:Te flux ratio, for simplicity in measurement, compares only the tellurium flux contributed by the second crucible 16 with the mercury flux contributed by the delivery tube/reservoir assembly 14. The tellurium flux contributed by the first crucible 12 (CdTe) need not be considered, for the most part, because the cadmium and tellurium are incorporated at substantially the same rate and, thus, are not determinative of the number of metal vacancies 4* in the Group 11 sublattice. As a result, the flux from the first crucible 12 does not significantly control into which sublattice the arsenic will be incorporated.

To set the Hg:Te flux ratio to ensure a cation-rich surface condition, the sticking coefficient of mercury is estimated for the particular growth temperature. For example, at a growth temperature of about 170° C., the sticking coefficient of mercury may be estimated to be about $2 \times 10^{-3}$ and, thus, an Hg:Te flux ratio of no less than approximately 500:1 (because the sticking coefficient of tellurium is approximately 1.0) would be necessary to ensure a cation-rich surface condition. However, the sticking coefficient of mercury may be higher than $2 \times 10^{-3}$, in which case a cation-rich surface condition may still be established with a Hg:Te flux ratio lower than 500:1. A sample HgCdTe film fabricated at a growth temperature of 170° C. with an Hg:Te flux of 500 exhibited excellent properties over a wide range of temperatures. The Hall data provided below in Table 1 shows that the HgCdTe film was p-type at 300 K, 77 K, and even 30 K.

TABLE 1

| Temp. (K) | Carrier Concentration | Mobility (cm/Vsec) |
|---|---|---|
| 30 | $3 \times 10^{16}$ cm$^{-3}$ | $3.0 \times 10^2$ |
| 77 | $5 \times 10^{16}$ cm$^{-3}$ | $1.5 \times 10^2$ |
| 300 | $7 \times 10^{16}$ cm$^{-3}$ | $6.0 \times 10^1$ |

The sticking coefficient of mercury has been found to be a strong function of the growth temperature, decreasing significantly at higher growth temperatures. Consequently, the Hg:Te flux ratio may range from about 125 (for growth temperatures at about 145° C.) to about 1000 (for growth temperatures at about 175° C.), and, for the fabrication of IR detectors according to the present invention, preferably falls within a range from about 300 to about 500. Table 2 provides estimates of the mercury sticking coefficient at four growth temperatures, together with the estimated minimum Hg:Te flux ratio required to achieve a cation-rich growth condition.

TABLE 2

| Growth Temp. (K) | Hg Sticking Coefficient | Min. Hg:Te Flux Ratio |
|---|---|---|
| 145 | .008 | 125 |
| 155 | .004 | 250 |
| 165 | .002 | 500 |
| 175 | .001 | 1000 |

The capability to grow p-type doped HgCdTe films at higher growth temperatures is advantageous because the crystallinity generally improves with increasing growth temperatures. Balancing the competing interests of crystallinity and arsenic incorporation results in a preferred growth temperature preferably in a range from about 145° C. to about 175° C., and most preferably in a range from about 155 to about 165. For example, X-ray diffraction and SIMS data indicate that, while the crystallinity of the p-type cap layer 30 improves by a factor of three (3) if the growth temperature increases from about 145° C. to about 175° C., the arsenic incorporation decreases by a factor of 100 over that same range.

The following examples illustrate how predetermining the Hg:Te flux ratio allows for the fabrication of p-type doped HgCdTe films with sufficient arsenic doping at growth temperatures high enough to achieve suitable crystallinity. Also evidenced by the examples below is the strong dependence of the sticking coefficient of arsenic on the growth temperature. However, at higher growth temperatures, a lower arsenic sticking coefficient may also be addressed by increasing the arsenic flux by methods well known to those skilled in the art. As a result, the Hg:Te flux ratio, the arsenic flux, and the growth temperature may be critical growth parameters for the growth of certain HgCdTe films.

EXAMPLE 1

A p-type doped HgCdTe film was grown at 145° C. with an Hg:Te flux ratio of 400 in an MBE chamber with the following approximate vapor fluxes measured in terms of the partial pressure (in milliBar) of the material in front of the growing surface 34:

| Mercury | $3.60 \times 10^{-4}$ |
|---|---|
| Tellurium | $9.00 \times 10^{-7}$ |
| Cadmium telluride | $6.00 \times 10^{-7}$ |
| Arsenic | $8.00 \times 10^{-7}$ |

In addition, the arsenic source in the third crucible 18 was heated to approximately 280° C. The resulting p-type HgCdTe film had an arsenic concentration of $1 \times 10^{18}$ cm$^{-3}$ and a crystallinity level indicated by an X-ray diffraction curve having an FWHM (full width at half maxima) of 40 arc-sec.

EXAMPLE 2

Another p-type doped HgCdTe film was grown at 165° C. with an Hg:Te flux ratio of 1000 in an MBE chamber with the following approximate vapor fluxes measured in terms of the partial pressure (in milliBar) of the material in front of the growing surface 34:

| Mercury | $3.60 \times 10^{-4}$ |
|---|---|
| Tellurium | $3.60 \times 10^{-7}$ |
| Cadmium telluride | $5.50 \times 10^{-7}$ |
| Arsenic | $8.00 \times 10^{-7}$ |

The arsenic source in the third crucible was again heated to approximately 280° C. The resulting p-type HgCdTe film had an arsenic concentration of $1 \times 10^{17}$ cm$^{-3}$ and the X-ray diffraction curve had a FWHM of 50 arc-sec. The slight increase in the FWHM measurement is believed to be due to variations in the crystallinity of the substrate 24. As is known to those skilled in the art, for X-ray diffraction curves having an FWHM measurement lower than 55 arc-sec, the quality of the substrate 24 becomes the determinative factor.

Numerous modifications and alternative embodiments of the invention will be apparent to those skilled in the art in view of the foregoing description. Accordingly, this description is to be construed as illustrative only and is for the purpose for teaching those skilled in the art the best mode of carrying out the invention. The details of the structure may be varied substantially without departing from the spirit of the invention, and the exclusive use of all modifications which are within the scope of the appending claims is reserved.

What is claimed is:

1. A method of growing a p-type doped Group II–VI semiconductor film, comprising the steps of:
   (a) forming a lattice comprising mercury and a Group VI material wherein a cation-rich condition is established at a surface of the lattice;
   (b) generating an elemental Group V flux by evaporating an elemental Group V material; and
   (c) providing the elemental Group V flux to the surface of the lattice to grow the lattice with the elemental Group V material incorporated therein.

2. The method of claim 1, wherein the elemental Group V material comprises elemental arsenic.

3. The method of claim 1, wherein step (a) comprises generating, via evaporation, a Group II flux and a Group VI flux according to a predetermined Group II:Group VI flux ratio to establish the cation-rich condition at the surface of the lattice.

4. The method of claim 3, further comprising the steps of:
   generating a flux comprising cadmium and tellurium by evaporating cadmium telluride; and
   providing the flux comprising cadmium and tellurium to the surface of the lattice;
   wherein the Group VI material is tellurium.

5. The method of claim 3, further comprising the step of annealing the lattice at a temperature in a range from about 250° C. to about 300° C.

6. The method of claim 3, wherein step (a) occurs at a temperature in a range from about 155° C. to about 165° C. and the Group II:Group VI flux ratio is in a range from about 300 to about 500.

7. The method of claim 3, wherein the lattice is formed on a substrate comprising a silicon support and a CdTe buffer layer.

8. The method of claim 3, wherein the lattice is formed on a substrate comprising CdZnTe.

9. A method of fabricating a p-type doped Group II–VI semiconductor layer, comprising the steps of:
   (a) growing a lattice comprising mercury and a Group VI material wherein a cation-rich condition is established at a surface of the lattice;
   (b) generating a dopant flux consisting essentially of elemental arsenic; and
   (c) providing the elemental arsenic in the dopant flux to the surface of the lattice to grow the lattice with the elemental arsenic incorporated therein.

10. The method of claim 9, wherein step (a) comprises generating, via evaporation, a mercury flux and a tellurium flux according to a predetermined Hg:Te flux ratio to establish the cation-rich condition at the surface of the lattice.

11. The method of claim 10, wherein the predetermined Hg:Te flux ratio is in a range from about 125 to about 1000.

12. The method of claim 11, further comprising the step of annealing the lattice.

13. The method of claim 11, further comprising the steps of:
   generating a flux comprising cadmium and tellurium by evaporating cadmium telluride; and
   providing the flux comprising cadmium and tellurium to the surface of the lattice.

14. The method of claim 13, wherein step (a) occurs at a temperature in a range from about 155° C. to about 165° C. and the predetermined Hg:Te flux ratio is in a range from about 300 to about 500.

15. A method of fabricating a p-type doped HgCdTe semiconductor film, comprising the steps of:
   (a) generating a first flux comprising mercury and a second flux comprising tellurium according to a predetermined Hg:Te flux ratio;
   (b) generating an elemental Group V flux; and
   (c) providing the elemental Group V flux, the first flux and the second flux to a substrate to grow a lattice thereon;
   wherein the Hg:Te flux ratio is in a range from about 125 to about 1000 to direct the elemental Group V flux to a Group VI sublattice of the lattice.

16. The method of claim 15, wherein the elemental Group V flux comprises arsenic.

17. The method of claim 16, further comprising the steps of:
   generating a third flux comprising cadmium; and
   providing the third flux to the substrate such that the lattice comprises an HgCdTe alloy.

18. The method of claim 17, wherein step (c) occurs at a temperature in a range from about 155° C. to about 165° C.

19. The method of claim 18, wherein the substrate comprises a silicon support and an intermediate CdTe buffer layer.

20. The method of claim 18, wherein the substrate comprises CdZnTe.

* * * * *